United States Patent [19]
Fujihira et al.

[11] Patent Number: 5,757,046
[45] Date of Patent: May 26, 1998

[54] MOS TYPE SEMICONDUCTOR DEVICE

[75] Inventors: Tatsuhiko Fujihira; Takeyoshi Nishimura; Takashi Kobayashi; Toshihiro Arai, all of Nagano, Japan

[73] Assignee: Fuji Electric Company Ltd., Japan

[21] Appl. No.: 691,502

[22] Filed: Aug. 2, 1996

Related U.S. Application Data

[63] Continuation-in-part of Ser. No. 368,815, Jan. 6, 1995, abandoned.

[30] Foreign Application Priority Data

| | | | |
|---|---|---|---|
| Jan. 7, 1994 | [JP] | Japan | 6-000364 |
| May 24, 1994 | [JP] | Japan | 6-108873 |
| Nov. 10, 1994 | [JP] | Japan | 6-276196 |

[51] Int. Cl.$^6$ ........................ H01L 29/78; H01L 29/739
[52] U.S. Cl. ..................... 257/339; 257/341; 257/139; 257/487; 257/345; 257/401
[58] Field of Search ........................ 257/328, 329, 257/335, 339, 341, 342, 345, 139, 133, 401, 487

Primary Examiner—Jerome Jackson
Assistant Examiner—John Guay
Attorney, Agent, or Firm—Rossi & Associates

[57] ABSTRACT

The invention improves the withstand voltage and avalanche withstand capability of a MOSFET, by preventing avalanche currents from localizing to the corners of the quadrangular cells of a MOSFET. The MOSFET includes a square channel region of the second conductivity type formed in a surface layer of a semiconductor substrate of the first conductivity type, a well region of high impurity concentration formed in the central portion of the channel region, a source region of the first conductivity type formed in a surface layer of the well region, and a MOS structure formed on the surface of the above described constituents. The cell structure, in which a diagonal of the square channel region and a diagonal of the nearest neighboring channel regions lie on a line, narrows a spacing between the corners of the neighboring channel regions to encourage pinch-off of a depletion layer and suppresses localization of avalanche currents to the corners of the channel regions. By connecting the corner of the neighboring channel regions with stripe regions of high resistivity, the depletion layer expands more easily.

33 Claims, 14 Drawing Sheets

5,757,046

MOS TYPE SEMICONDUCTOR DEVICE

CROSS-REFERENCE TO RELATED APPLICATIONS

This application is a continuation-in-part application of Ser. No. 08/368,815 filed Jan. 6, 1955, now abandoned, the contents of which are incorporated herein by reference.

FIELD OF THE INVENTION

The present invention relates to a MOS type semiconductor device (hereinafter referred to as MOSFET), an insulated gate bipolar transistor, etc., which is comprised of a plurality of source regions, having a gate with a metal-oxide film-semiconductor (MOS) structure, scattered in a surface layer of a semiconductor substrate.

BACKGROUND

The MOS type semiconductor device has been used very often in switching circuits because of its low ON-resistance and fast switching speed. FIGS. 4(a) to 4(c) show an example of a conventional MOS type semiconductor device, in which FIG. 4(a) is a top plan view, FIG. 4(b) a sectional view along C—C of FIG. 4(a), and FIG. 4(c) a sectional view along D—D of FIG. 4(a). In FIGS. 4, a plurality of quadrangular p+ well regions 2 are formed in a surface layer of an n-type semiconductor substrate 1. A plurality of quadrangular p-channel regions 3 are formed around the p+ well diffusion layers 2. An n+ source region 4 is formed in a surface layer of the p-channel region 3. A gate electrode 5, made for example of polycrystalline silicon, is disposed through a gate oxide film 6 over the surface of the p-channel region 3 between the source region 4 and the exposed surface of the n-type substrate 1. A source electrode 8 of Al—Si alloy, which contacts commonly with the p+ well region 2 and the n+ source region 4 and is insulated from the gate electrode 5 by an inter-layer insulation film 7 of BPSG (phosphorus silicate glass), is extended over the gate electrode 5. Hereinafter, a unit structure comprised of the p-channel region 3, the n+ source region 4, and the source electrode 8 as shown in FIGS. 4 is referred to as "quadrangular cell". Though the cell structure shown in FIG. 4(a) is explained by designating the cell as a "quadrangular cell", the corners of the cell rarely have an angle of 90° or less. In the actual semiconductor devices, the corner of the cell is more or less rounded or the actual cell is formed in an octagon by cutting off the corners of a quadrangular cell. Hereinafter, a polygonal cell, which is defined by two pairs of parallel major sides and extensions of the non-parallel major sides of which cross at around the right angle, will be referred to as "quadrangular cell". When the non-parallel major sides do not cross, the corner of the quadrangular cell is assumed to be located near the cross point of the extensions of the non-parallel major sides and a diagonal of the quadrangular cell is defined as a line segment connecting the assumed corners opposed facing. In the actual MOSFET, many quadrangular cells are arranged side by side.

Since, snubber circuits have recently been eliminated from switching circuits for circuit simplification and since the down-sizing of the switching circuits has been advanced, MOSFETs used as a switching device in the switching circuits tend to be affected by surge voltage. Since the surge voltage causes a breakdown of the MOSFET, improvement of breakdown withstand capability (avalanche withstand capability) of the MOSFETs has been required. In the above described conventional MOSFET, the p+ well region 2 is deeply formed to improve the avalanche withstand capability. However, the deep p+ well region affects to other properties such as ON-resistance of the MOSFET. FIG. 5 shows the avalanche withstand capability (solid line) and ON-resistance (broken line) versus p+ well depth relations in a MOSFET element with ratings of 900 V and 5 A. In FIG. 5, the axis of abscissa represents diffusion depth of the p' well region 2 and the axis of ordinate represents avalanche withstand capability and ON-resistance. As shown in FIG. 5, the avalanche withstand capability is improved with increasing depth of the p+ well region. However, the ON-resistance also increases with increasing depth of the p+ well region. Therefore, it takes a considerable period of time to experimentally determine the manufacturing process parameters for obtaining depth of the p+ well region at which the avalanche withstand capability is appropriately balanced with the ON-resistance. In addition, if the avalanche withstand capability is balanced with the ON-resistance, improvement of the avalanche withstand capability remains within a limited range.

In view of the foregoing, an object of the present invention is to provide a MOSFET which improves avalanche withstand capability without sacrificing other properties.

SUMMARY OF THE INVENTION

The object of the present invention is achieved by a MOS type semiconductor device, including a semiconductor layer of a first conductivity type, a plurality of quadrangular cells, each thereof having four major sides and further including a channel region of a second conductivity type formed in a surface layer of the semiconductor layer, and a source region of the first conductivity type formed in the surface layer of the channel region, the sides of which lying in parallel to the sides of the source region, in which the distance between corners of the channel regions of two quadrangular cells, the corners of which are opposed facing to each other, is shorter than the distance between sides of the channel regions of two quadrangular cells, the sides of which are opposed facing to each other. It is preferable to align the diagonals of the channel regions of two nearest neighboring quadrangular cells on a line. It is preferable to separate the distance between the opposed facing corners of the channel regions of two nearest neighboring cells by 4 µm or less. It is preferable to join the opposed facing corners of the channel regions of two nearest neighboring cells with each other. It is preferable to form stripe regions, of the second conductivity type and with higher resistivity than the resistivity of the channel region, more shallow than the channel region in the surface layer of the semiconductor layer in contact with the channel regions on the diagonals of the quadrangular cells. It is preferable to form stripe regions, of the first conductivity type and with higher resistivity than the resistivity of the semiconductor layer, more shallow than the channel region in the surface layer of the semiconductor layer in adjacent to the channel region on the diagonals of the cells. It is preferable to form regions, with higher impurity concentration than the impurity concentration of the second conductivity type, in the channel region in contact with the stripe regions. The object of the present invention is also achieved by a MOS type semiconductor device which is comprised of peripheral cells, at least a portion of the outermost side of the channel region of which lies in parallel to the side of a semiconductor chip, formed on the outermost periphery, inside of which the quadrangular cells are formed, of the semiconductor chip. The source region of the first conductivity type is preferably formed in the peripheral cell on its central side of the semiconductor chip. The area of the peripheral cell is preferably wider than the area of the quadrangular cell.

The object of the present invention is also achieved by a MOS type semiconductor device which is comprised of corner cells, the outermost side of a channel region of which is an arc convex toward the corner of the semiconductor chip, are formed in the corners of the semiconductor chip. The outermost side of the channel region of the corner cells is preferably a polygonal line imitating an arc convex toward the corner of the semiconductor chip. The area of the corner cell is preferably wider than the area of the peripheral cell.

The object of the present invention is also achieved by providing the MOS type semiconductor device with a shallow base region of a second conductivity type, the impurity concentration of which is higher than the impurity concentration of the channel region and the diffusion depth of which is shallower than the diffusion depth the channel region, is formed in a portion of the surface layer of the channel region. The region of the second conductivity type under the shallow base region is preferably consisted of the channel region.

BRIEF DESCRIPTION OF THE DRAWINGS

The invention will be described in greater detail with reference to the accompanying drawings, wherein.

DETAILED DESCRIPTION OF THE PREFERRED EMBODIMENTS

Figure 6A:
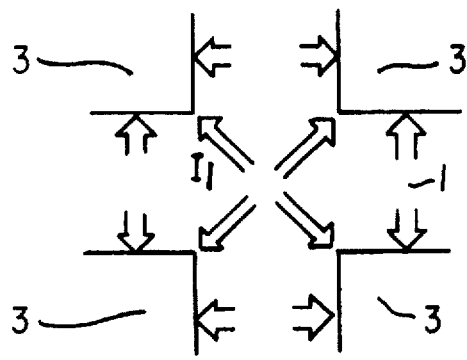
FIG. 6(a) is a top plan view for explaining flow of avalanche currents in the conventional MOSFET.
Figure 6B:
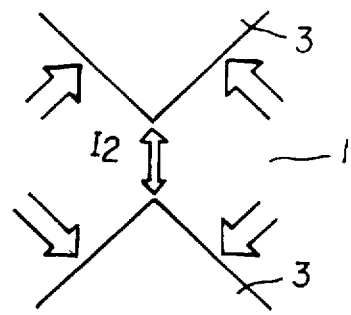
FIG. 6(b) is a top plan view for explaining flow of avalanche currents in the MOSFET according to the present invention.
Figure 7:
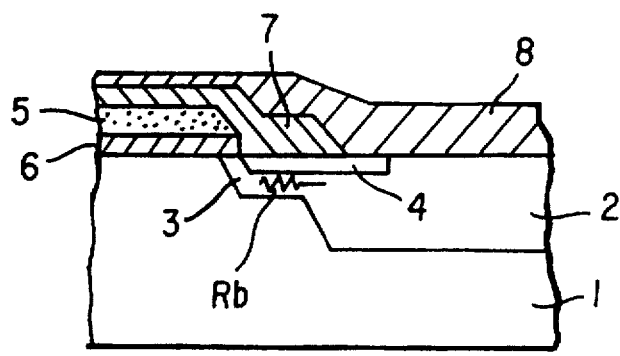
FIG. 7 is a sectional view showing a parasitic bipolar transistor which appears near the surface of the MOSFET.

FIG. 6(a) is a top plan view for explaining flow of avalanche currents in the conventional MOSFET, and FIG. 6(b) is a top plan view for explaining flow of avalanche currents in the MOSFET according to the present invention. In FIG. 6(a), the distance between the channel regions 3 around the corners of the cells is longer than the distance between the sides of the channel regions 3. Since a withstand voltage is low around the corner of the cells because of large curvature of the p-channel region 3, the avalanche currents I1 caused by avalanche breakdown concentrate to four corners of the p-channel region 3 from a region surrounded by the four corners of the channel regions 3 as shown in FIG. 6(a). Because of this, the avalanche withstand capability of the MOSFET lowers around the corner of the quadrangular cells. In contrast, if two quadrangular cells are aligned in close proximity with each one of their diagonals lying on a line as shown in FIG. 6(b), this configuration encourages pinch-off of a depletion layer around the corner of the quadrangular cells and prevents the withstand voltage from lowering. Since avalanche currents I2 flow to two opposed facing corners of the channel regions 3, arranged in close proximity to each other, from a narrow region between the two opposed facing corners of the channel regions 3 as shown in FIG. 6(b), the I2 decreases to half the I1. As a result, the avalanche current, which flows through the resistance Rb of the p-channel region 3 beneath the n+ source region 4 shown in FIG. 7, decreases. The avalanche current decrease prevents a parasitic bipolar transistor, consisted of the semiconductor layer of the first conduction type, the channel region of the second conduction type and the source region of the first conduction type, from mal-firing, and therefore, prevents the MOSFET from being broken down. In this configuration, narrower distance between the channel regions of the two cells is preferable, and the distance of 4 µm or less effectively prevents the MOSFET from breakdown. In addition, a configuration, in which channel regions are so formed by horizontal diffusion that corners of the channel regions of the neighboring cells are joined to each other on the cell diagonals, most effectively prevents the MOSFET from breakdown.

The stripe regions, of the same conductivity type with the channel region and high resistivity and formed on a line connecting the corners of the neighboring cells, encourage expansion of the depletion layer around the cell corners and prevent the withstand voltage from lowering. The stripe regions, of the same conductivity type with the semiconductor layer surrounding the channel region and higher resistivity than that of the semiconductor layer and formed on the line connecting the corners of the neighboring cells, also encourage expansion of the depletion layer around the cell corners, and prevent the withstand voltage and the avalanche withstand capability from degrading. By doping the impurities in the channel region simultaneously with formation of the stripe regions, the parasitic bipolar transistor described above is prevented from mal-operating even when the avalanche current flows from the stripe region to the channel region, because the impurity concentration of the region formed by the impurity doping is higher than that in the channel region and the resistivity is low in the heavily doped region.

By aligning at least a portion of the outermost side of the channel region of the peripheral cells, formed on the outermost periphery, inside of which the quadrangular cells are formed, in parallel to the side of the semiconductor chip, the pn junction is formed in straight and localization of the electric field is suppressed. By forming the source region of the peripheral cell only on its central side of the semiconductor chip, the parasitic transistor is prevented from operating even when the avalanche current flows, because the source region of the first conductivity type is not formed on the peripheral side of the peripheral cell. Further, by expanding the area of the peripheral cell more widely than the area of the square cell, the avalanche energy absorption capability, and therefore, the avalanche withstand capability are improved.

By forming the corner cells, the outermost side of a channel region of which is an arc convex toward the corner of the semiconductor chip or a polygonal curve imitating the arc, in the corners of the semiconductor chip, the curvature of the pn junction is reduced and the localization of the electric field is suppressed.

By expanding the area of the corner cell more widely than the area of the square cell, the avalanche energy absorption capability, and therefore, the avalanche withstand capability are improved. Further, the provision of a shallow base region of a second conductivity type, the impurity concentration of which is higher than the impurity concentration of the channel region and the diffusion depth of which is shallower than the diffusion depth the channel region, in a portion of the surface layer of the channel region, improves the avalanche withstand capability, because the conductivity of the channel region increases, the base resistance of the parasitic transistor decreases, and therefore, the parasitic transistor hardly operates. Especially, by providing the region of the second conductivity type under the shallow base region only with the channel region, the avalanche withstand capability is improved even when the well region of the second conductivity type does not exist.

Figure 1:
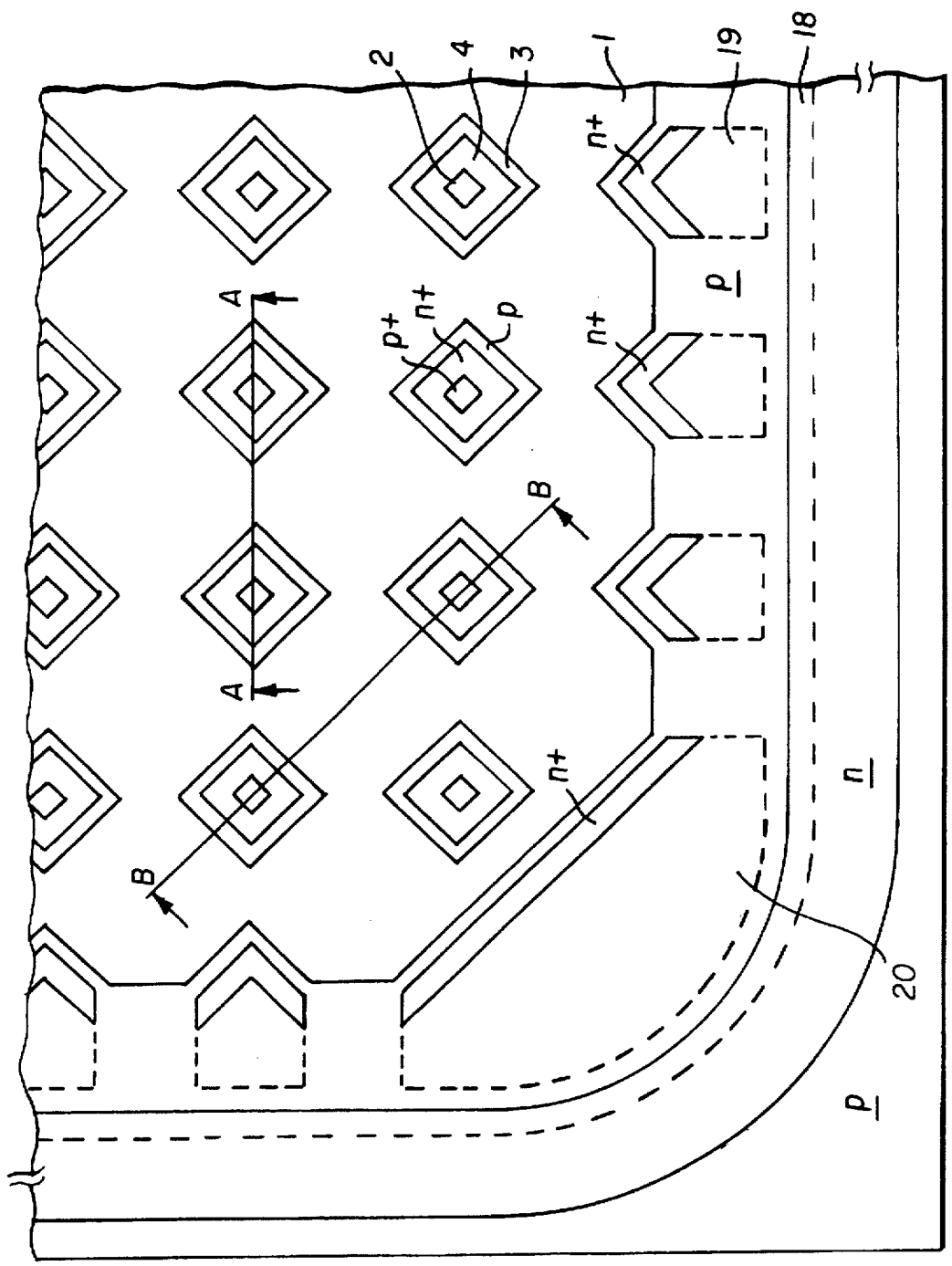
FIG. 1 is a top plan view showing the firsts embodiment of a MOSFET of the present invention.
Figure 2A:
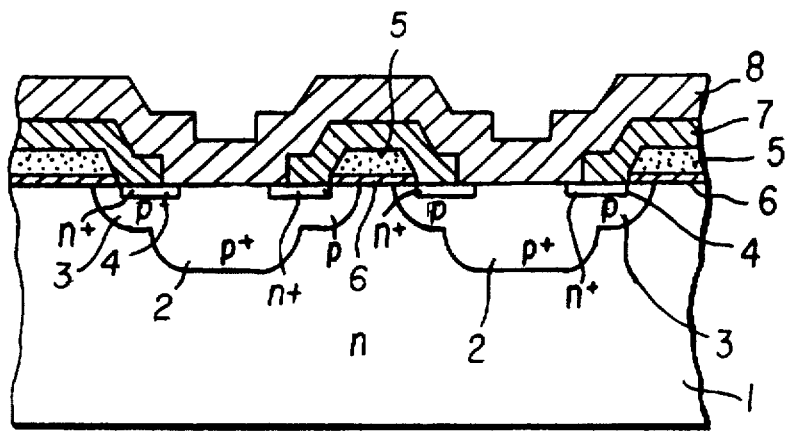
FIG. 2(a) is a sectional view along A—A of FIG. 1, and FIG. 2(b) a sectional view along B—B of FIG. 1.
Figure 2B:
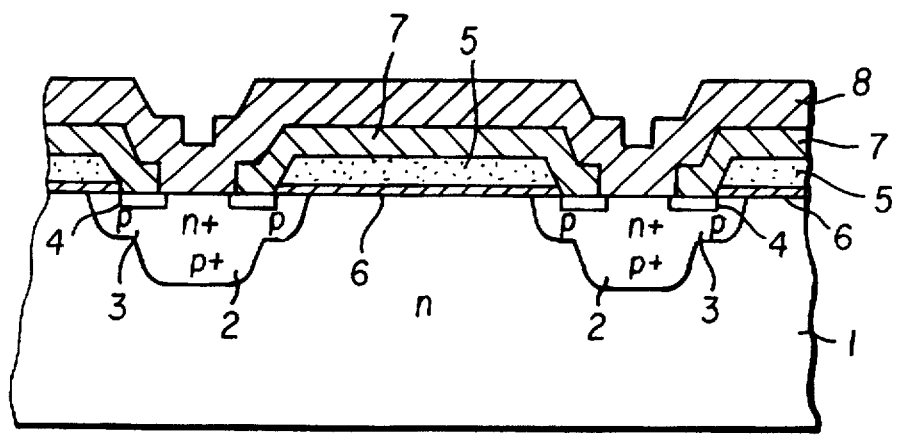
Figure 4A:
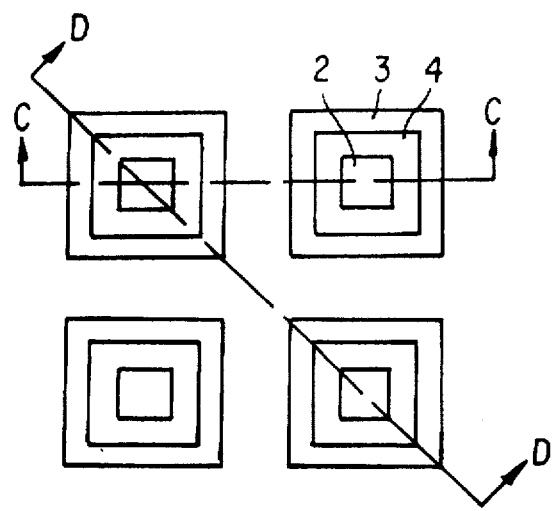
FIG. 4(a) is a top plan view showing an example of the MOSFET according to the prior art.
Figure 4B:
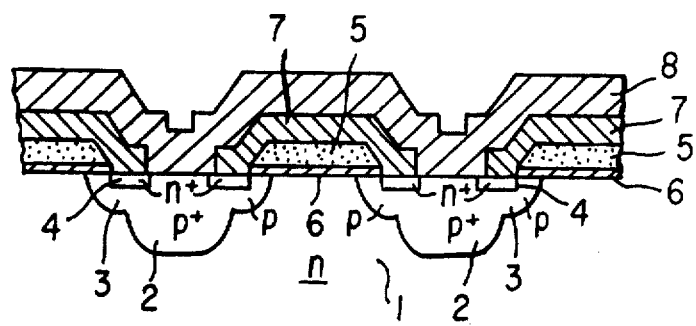
FIG. 4(b) is a sectional view along C—C of FIG. 4(a)
Figure 4C:
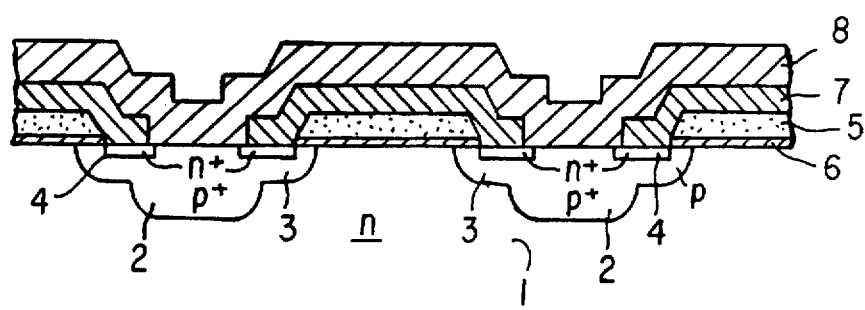
FIG. 4(c) is a sectional view along D—D of FIG. 4(a)
Figure 5:
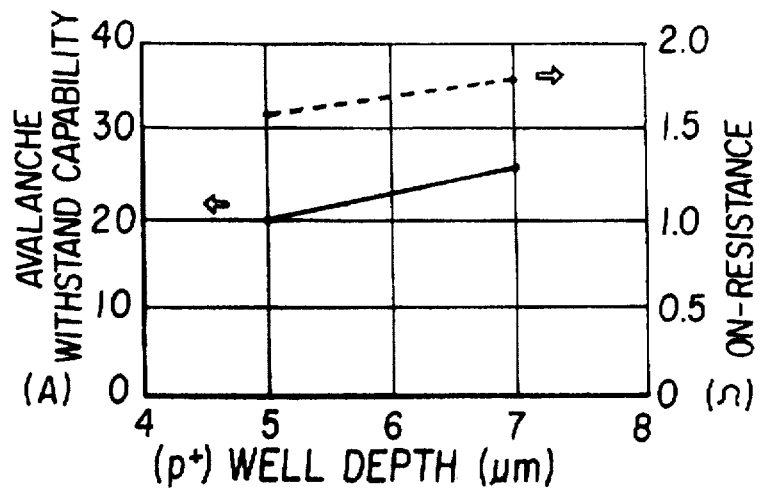
FIG. 5 is a graph showing the avalanche withstand capability and ON-resistance versus p+ well depth relations of the MOSFET.

The structural details of a MOSFET of the present invention will now be described. FIG. 1, FIG. 2(a) and FIG. 2 (b) show an embodiment of a MOSFET of the present invention. FIG. 1 is a top plan view. FIG. 2(a) a sectional view along A—A of FIG. 1, and FIG. 2(b) a sectional view along B—B of FIG. 1. In FIGS. 1, 2(a) and 2(b), the same parts with those in FIGS. 4 are designated by the same reference numerals.

As shown in FIG. 1, quadrangular cells, each of which has four major sides and is comprised of a quadrangular p-channel region 3, and an n+ source region 4 and a p+ well region 2 formed in the p-channel region 3, are arranged with their corners positioned in the closest proximity. Though the diagonals of two nearest neighboring quadrangular cells are aligned on a line, since quadrangular cells are arranged with equal pitch in this embodiment, the quadrangular cell may be a rectangle. In practice, the corner of the quadrangular cell is not right angle, and is curved with a radius of curvature of 1.5 to 2 μm. As explained with reference to FIG. 6, the avalanche current around the corners of the neighboring quadrangular cells is small. Though the region surrounded by four quadrangular cells is wide and the avalanche current is large, the surrounding quadrangular cells withstand a large avalanche current, because the opposed facing pn junctions are straight. In FIG. 2(a), the p-channel region 3 is formed in the surface layer of the n-type substrate 1 with resistivity of 45 Ω cm and thickness of 100 μm. The p+ well region 2 deeper than the p-channel region 3 is formed from the surface of the p-channel region 3, and the n+ source region 4 is formed in the surface layer of the p+ well region 2. A polycrystalline silicon gate electrode 5 is disposed through a gate oxide film 6 on the surface of the p-channel region 3 between the n+ source region 4 and the exposed portion of the substrate 1. A source electrode 8 is disposed in common contact with the n+ source region 4 and the p+ well region 2 and extends over the gate electrode 5 through an inter layer insulation film 7. A drain electrode (not shown) is deposited on the back surface of the n-type substrate 1 through an n-type substrate layer. The parameters of an experimental model of the MOSFET of FIG. 1 are as follows. The dose amount in the p-channel region 3 by ion implantation is $1\times10^{14}$ cm$^{-2}$; the diffusion depth of the p-channel region 3 is 3 μm; the dose amount in the p+ well region 2 is $1\times10^{15}$ cm$^{-2}$; the diffusion depth of the p+ well region 2 is 8 μm; the dose amount in the n+ source region 4 is $5\times10^{15}$ cm$^{-2}$; and the diffusion depth of the n+ source region 4 is 0.3 μm. The size of the p-channel region 3 is 33 μm×33 μm, and the pitch between the p-channel regions 3, 3 is 50 μm. At this pitch, distance between the corners of two the p-channel regions 3, 3 is about 4 μm.

Since two quadrangular cells are positioned most closely across the opposed facing corners of the p-channel regions 3, 3, as illustrated in the A—A section shown in FIG. 2(a), a depletion layer which spreads from the p-channel region 3 when an electric field is applied easily joins a depletion layer spreading from the adjacent the p-channel region 3. Since the curvature of the depletion layer is usually small, withstand voltage lowering at the corners of the square cell, at which avalanche breakdown occurs most easily, does not take place and the avalanche withstand capability is improved. Since the portion of the n-type substrate 1 under the gate electrode 5 is widely spaced between two quadrangular cells on the cross section shown in FIG. 2(b), a wide current path is obtained when the MOSFET is ON, and the ON-resistance of the MOSFET is suppressed at a low value.

In FIG. 1, peripheral cells 19, the outermost side of which lies in parallel to the side of the semiconductor chip, and corner cells 20, the outermost side of which is arched toward the corner of the semiconductor chip, are arranged outside the portion of the semiconductor chip in which the quadrangular cells are arranged. Since the curvature of the outermost pn junctions become small by this arrangement, the electric field hardly localizes and the avalanche withstand capability is improved. An n+ source region 4 is formed in a portion of the peripheral cell 19 and the corner cell 20 located on the side of the central part of the chip. The avalanche withstand capability is improved by the following reason. Though the avalanche breakdown usually starts at first from the outermost pn junction, since the portion lacks n+ source region, the parasitic transistor does not work even when a large avalanche current flows and the avalanche withstand capability is improved. Since the peripheral cell 19 and the corner cell 20 absorbs more avalanche energy by virtue of their wider areas than that of the square cell, the avalanche withstand capability is further improved. The broken line near the peripheral cell 19 indicates a boundary of the polycrystalline silicon ring 18. The outermost side of the p-channel region of the corner cell 20 is not necessarily an arc convex towards the corner of the semiconductor chip. Even an outermost zigzag side imitating an arc is effective for avoiding the electric field localization.

Figure 3:
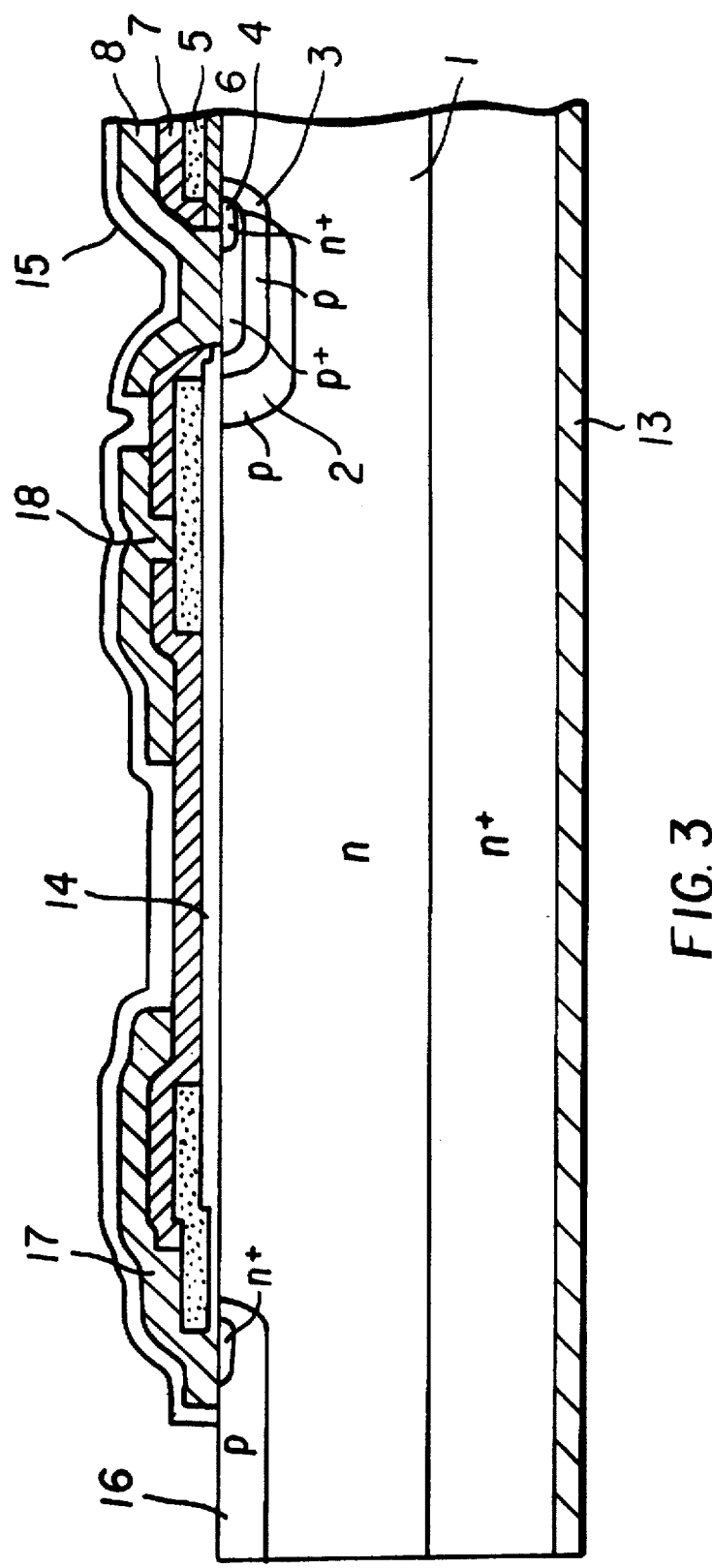
FIG. 3 is a sectional view showing a portion around the periphery of the MOSFET chip of FIG. 1.

FIG. 3 is a sectional view showing a portion around the periphery of the MOSFET chip. A polycrystalline silicon ring 18 for leading out gate leads is disposed on the outermost p+ well region 2 through a thick field oxide film 14, and a p-peripheral region 16 is disposed in the surface layer of the periphery of the chip. A peripheral electrode 17 is disposed on the p-peripheral region 16.

The parameters of each part are as follows. The impurity concentration of the n-type substrate 1 is $1 \times 10^{13}$ to $3 \times 10^{16}$ cm$^{-3}$; the thickness of the n-type substrate 1 is 5 to 150 μm the boron ion dose amount in the p+ well region 2 is $5 \times 10^{14}$ to $2 \times 10^{15}$ cm$^{-2}$; the diffusion depth of the p+ well region 2 is 5 to 10 μm; the boron ion dose amount in the p-channel region 3 is $3 \times 10^{13}$ to $5 \times 10^{14}$; the diffusion depth of the p-channel region 3 is 2 to 4 μm; the arsenic ion dose amount in the n+ source region 4 is $4 \times 10^{15}$ to $5 \times 10^{15}$ cm$^{-2}$; the diffusion depth of the n+ source region 4 is 0.2 to 0.3 μm; the thickness of the gate electrode (poly silicon) 5 is 500 to 1000 nm; the thickness of the gate oxide film 6 is 25 to 120 nm; the thickness of the inter layer insulation film (BPSG) 7 is 0.6 to 1.1 μm; the thickness of the source electrode (Al—Si) 8 is 3 to 5 μm; the thickness of the field oxidation film 14 is 500 to 1100 nm; and the thickness of the passivation film (SiN) is 800 nm. As for the p-type base region, the following three combination can be adopted: (1) the p-channel region 3 and the p+ well region 2; (2) the p-channel region 3 and a shallow p-type base region 11; (3) the p-channel region 3, the p+ well region 2, and the shallow p-type base region 11.

The first MOSFET of FIGS. 1 and 2 operates as follows. When a positive voltage of more than a predetermined value is applied to the gate electrode 5, an inversion layer is yielded near the surface of the p-channel region 3 underneath the gate electrode 5 and the portion between the n+ source region 4 and the n-type substrate 1 becomes conductive. A current flows if a voltage is applied at this instance between the drain electrode 13 disposed on the back surface of the n-type substrate 1 and the source electrode 8. It is necessary for the exposed portion of the n-type substrate 1 to have an area wide enough to flow the current. Usually, there exists an optimum value for the ratio of the area of the cells to the exposed area of the n-type substrate 1. If the distance between the corners of two p-channel regions is set too long, the exposed area of the n-type substrate 1 occupies too wide of an area, which causes an increase in ON-resistance. If the distance between the corners of two p-channel regions is set too short, the exposed area of the n-type substrate 1 occupies too narrow area, which also causes an increase in ON-resistance. The optimum ratio is 0.7 for the high withstand voltage MOSFET of 900 V class. When the distance between the corners of two p-channel regions is set at 4 μm, the ratio is 0.7. The optimum ratio for the lower withstand voltage MOSFET is more than 0.7, corresponding to which optimum distance between the corners of two p-channel regions becomes shorter than 4 μm.

Figure 8:
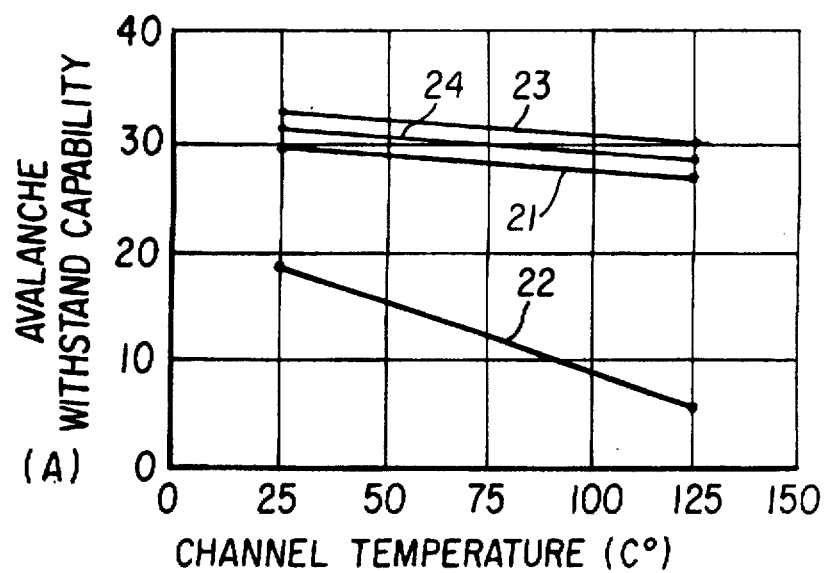
FIG. 8 is a graph comparing the temperature variation of the avalanche withstand capabilities of the MOSFETs of the present invention and the conventional MOSFET.

FIG. 8 is a graph for comparing the temperature dependence of the avalanche withstand capability of the MOSFET of FIGS. 1 and 2 of the present invention with that of the conventional MOSFET of FIG. 4. the withstand capability of the embodiment of the MOSFET of the present invention shown by a line 21 is 1.6 times at 25° C. and 4.7 times at 125° C. as large as the withstand capability of the conventional MOSFET, the cell dimensions of which are the same with those of the MOSFET of the present invention: the area of the p-channel region is 33 μm×33 μm, and the pitch between the quadrangular cells is 50 μm.

In the first embodiment of FIG. 1, the exposed area of the n-type substrate 1 is almost entirely covered by the polycrystalline silicon gate electrode 5. Since, though the gate electrode is narrow between the corners of the quadrangular cells, the narrow portion is short, the overall gate resistance is lowered as compared with the gate resistance of the conventional MOSFET.

The first embodiment of the present MOSFET can be manufactured only by changing the mask pattern without adding extra processing steps to the processing steps for the MOSFET of the prior art.

Figure 9:
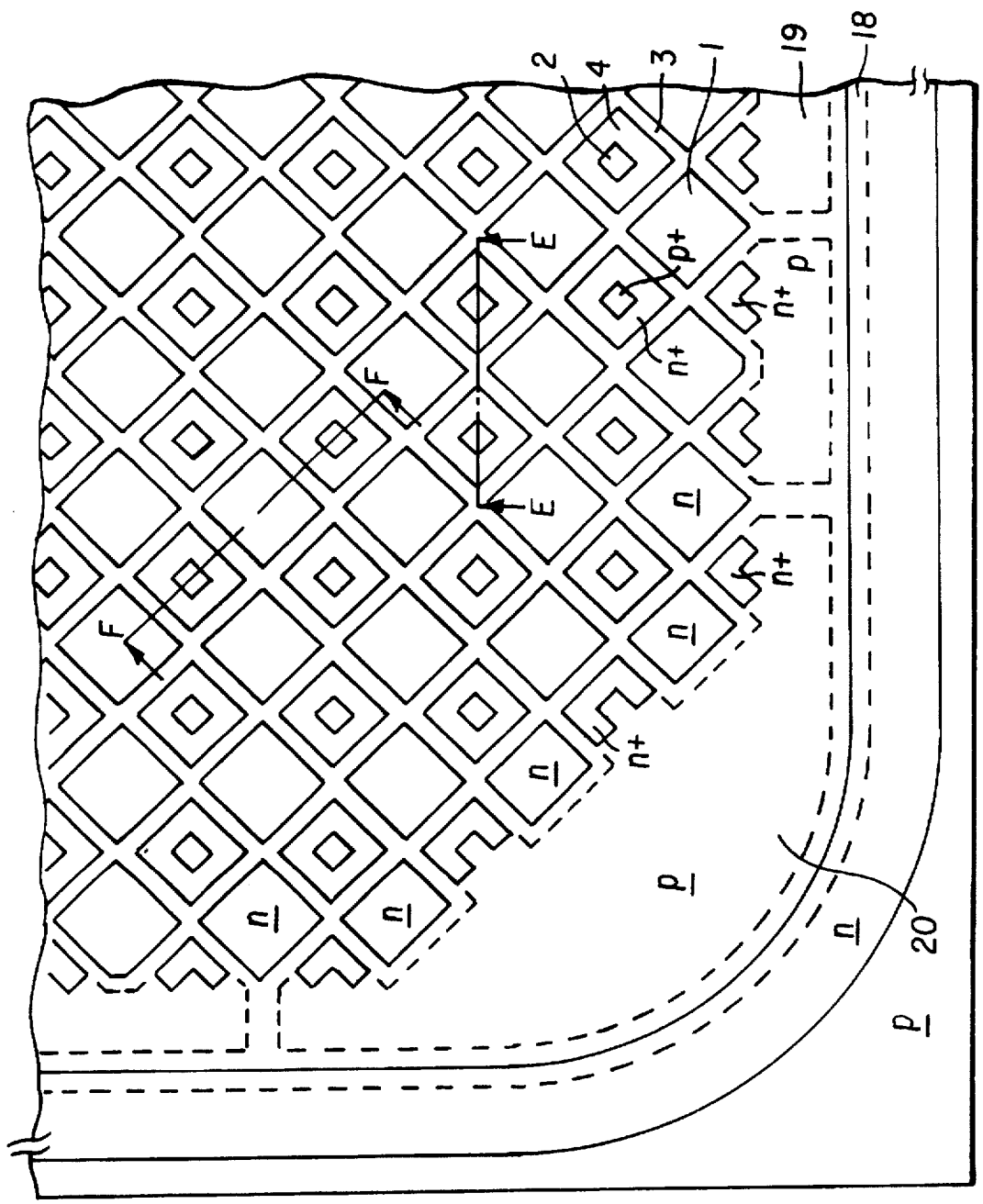
FIG. 9 is a top plan view showing the second embodiment of the MOSFET according to the present invention from which an upper structure of the MOSFET is omitted.
Figure 10A:
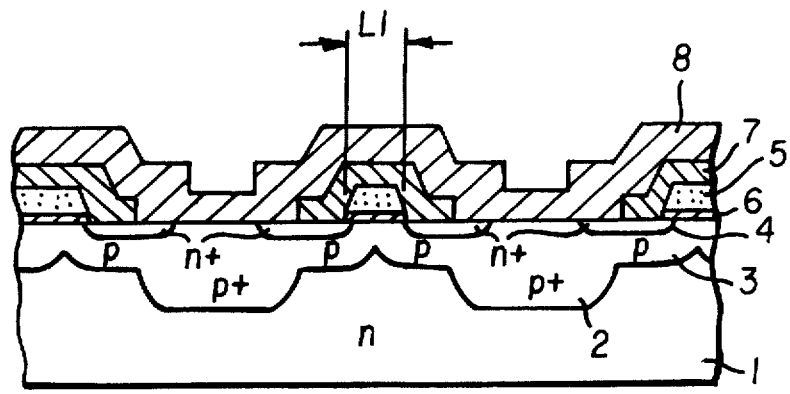
FIG. 10(a) is a sectional view along E—E of FIG. 9, and FIG. 10(b) a sectional view along F—F of FIG. 9(a)
Figure 10B:
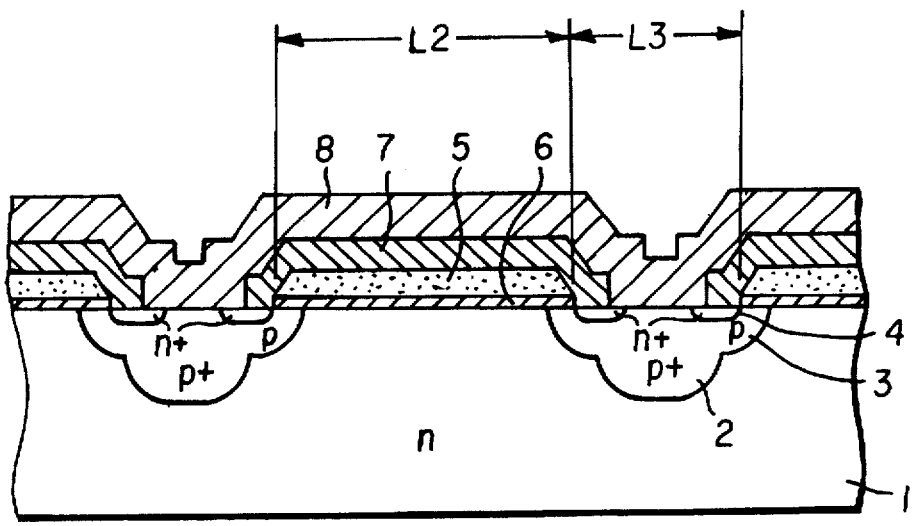

FIGS. 9, 10(a) and 10(b) show a second embodiment of the MOSFET according to the present invention. FIG. 9 is a top plan view from which an upper structure of the MOSFET is omitted. FIG. 10(a) a sectional view along E—E of FIG. 9, and FIG. 10(b) a sectional view along F—F of FIG. 9(a). In FIGS. 9, 10(a) and 10(b), the same parts with those in the figures already explained are designated by the same reference numerals. In FIG. 9, the space between the corners of the quadrangular cells is further narrowed from that of FIG. 1 until the p-channel regions 3 of two nearest neighboring quadrangular cells join each other at their corners. In FIG. 9, the n+ source region 4 is formed in the joined p-channel regions 3, and the p+ well region 2 is formed in the n+ source region 4. The E—E section shown in FIG. 10(a) clearly illustrates the junction of the p-channel regions 3. The neighboring p-channel regions 3 join each other underneath the gate electrode 5, by which the withstand voltage at the corner of the square cell and the avalanche withstand capability are prevented from lowering. The width L1 of the gate electrode 5 is 2 to 6 μm at the corner. In the F—F section shown in FIG. 10(b), two quadrangular cells are spaced widely enough and the n-type substrate 1 is exposed widely enough to suppress the ON-resistance of the MOSFET at a low value when the MOSFET is conductive. The width L2 of the gate electrode 5 is 6 to 20 μm and distance L3 between the gate electrodes 5, 5 is 6 to 12 μm in this cross section. In the second embodiment too, the peripheral cells 19 are formed in the outermost periphery of the portion of the semiconductor chip inside which the quadrangular cells are formed. The outer most side of p-channel region 3 of the peripheral cell 19 lies in parallel to the side of the semiconductor chip, and the n+ source region 4 in the peripheral cell 19 is located on the inner side of the semiconductor chip. The peripheral cell 19 occupies a wider area than the quadrangular cells. The outer most side of p-channel region 3 of the corner cell 20 arches toward the corner of the semiconductor chip, and the corner cell 20 occupies a wider area than the peripheral cell 19. By this configuration, the second embodiment also contributes to the improvement of the avalanche withstand capability.

The temperature dependence of the avalanche withstand capability of the second embodiment of the MOSFET is shown by the line 23 in FIG. 8. The avalanche withstand capability of the second embodiment is the MOSFET is 1.8 times at 25° C. and 5.0 times at 125° C. as large as the withstand capability shown by the line 22 of the MOSFET according to the prior art.

In the second embodiment of FIG. 9, the ratio of the area of the square cell to the exposed area of the n-type substrate 1 can be brought beyond 1.0 by overlapping the quadrangular cells at their corners. Therefore, the second embodiment is preferable to the MOSFET with relatively low withstand voltage.

The second embodiment of the present MOSFET can be also manufactured only by changing the mask pattern without adding extra processing steps to the processing steps for the MOSFET of the prior art.

Figure 11:
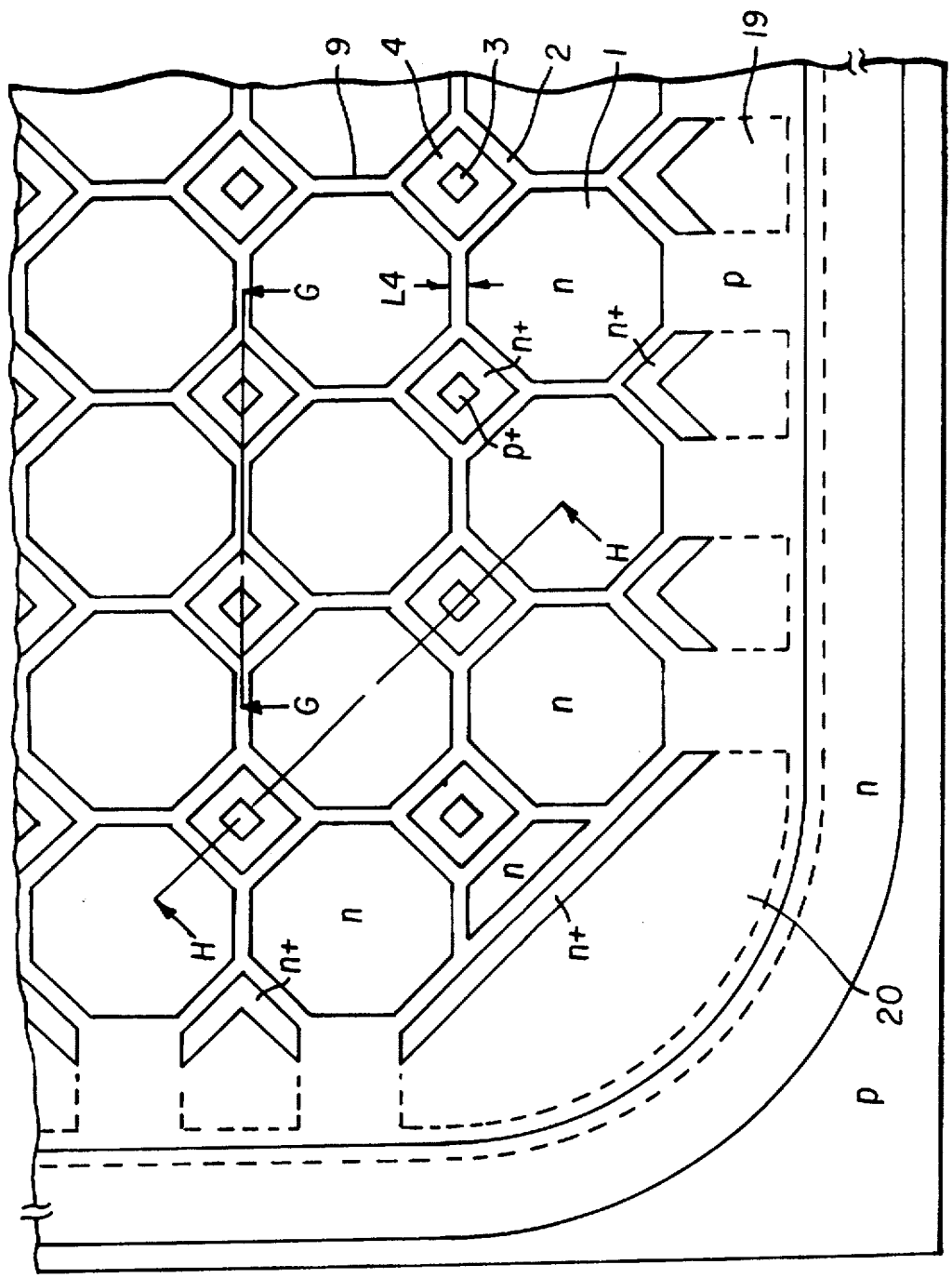
FIGS. 11 is a top plan view showing the third embodiment of the MOSFET according to the present invention from which an upper structure of the MOSFET is omitted.
Figure 12A:
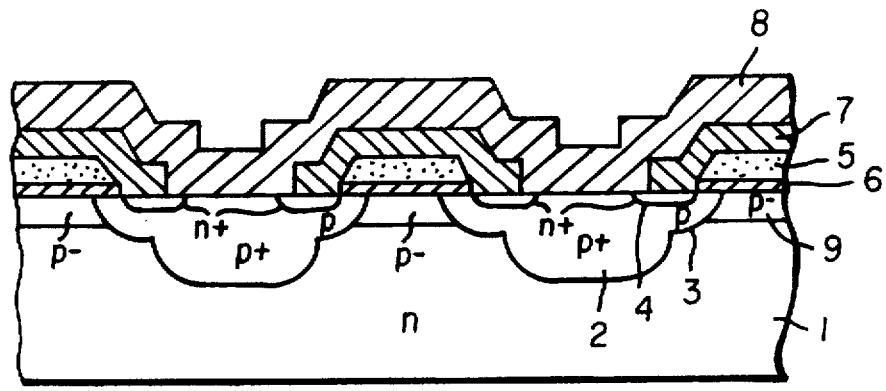
FIG. 12(a) is a sectional view along G—G of FIG. 11.
Figure 12B:
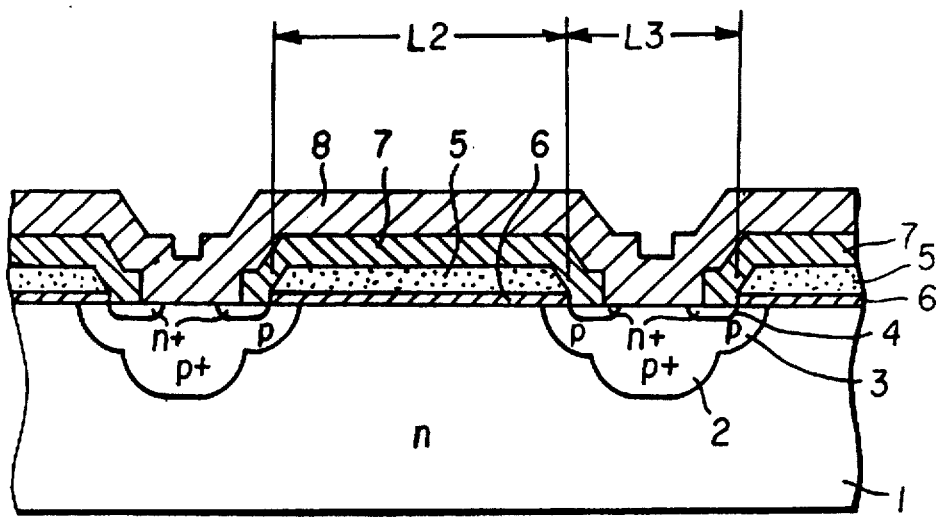
FIG. 12(b) is a sectional view along H—H of FIG. 11.

FIGS. 11, 12(a) and 12(b) show the third embodiment of the MOSFET according to the present invention. FIG. 11 is a top plan view from which an upper structure of the MOSFET is omitted. FIG. 12(a) a sectional view along G—G of FIG. 11, and FIG. 12(b) a sectional view along H—H of FIG. 11. In FIGS. 11, 12(a) and 12(b), the same parts with those in the figures already explained are designated by the same reference numerals. In the third embodiment, the corners of the neighboring quadrangular cells are closely located and linked by a p⁻stripe region 9 of high resistivity. The p⁻stripe region 9, which shows the conductivity type with that of the p-channel region 3, is a p-type diffusion layer with low impurity concentration. As shown in FIG. 11, the n+ source region 4 is formed in the joined p-channel regions 3, and the p+ well region 2 is formed in the n+ source region 4. The p-type substrate is exposed between the p⁻stripe region 9 and the p-channel region 3. The region 9 is formed, for example, by boron ion implantation and successive heat treatment. The boron ion dose amount in the p⁻stripe region 9 is $5\times10^{11}$ to $10^{13}$ cm$^{-2}$; the diffusion depth of the p⁻stripe region 9 is 0.5 to 4 μm: and the width L4 of the p⁻stripe region 9 is 2 to 8 μm. The depth of the p⁻stripe region 9 is the same with or less than that of the p-channel region 3 or shallower. FIG. 12(a) clearly shows the neighboring p-channel regions 3, 3 linked by the p⁻stripe region 9 on the cross section G—G of FIG. 11 underneath the gate electrode 5, by which the withstand voltage at the corner of the square cell is prevented from lowering. The avalanche withstand capability is further improved by doping impurities in a high impurity concentration region 31 near the corner of the p-channel region 3 simultaneously with the impurity doping for forming the p⁻stripe region 9, because the channel resistance of the high impurity concentration region 31 lowers to suppress operation of a parasitic npn transistor. A p⁻stripe region 9, which is formed in a nearby region to the corner of the p-channel region 3 and does not link the corners of the p-channel regions 3, also prevents the withstand voltage and the avalanche withstand capability from lowering. This example, in which an inversion layer is yielded in the surface layer of the p⁻stripe region 9 when a positive voltage is applied to the gate electrode 5, because the impurity concentration of the p⁻stripe region 9 is low, is also effective for reducing ON-resistance of the MOSFET. In the H—H section shown in FIG. 10(b), two quadrangular cells are spaced widely enough and the n-type substrate 1 is exposed widely enough to suppress the ON-resistance of the conductive MOSFET at a low value. The width L2 of the gate electrode 5 is 10 to 40 μm and distance L3 between the gate electrodes 5, 5 is 6 to 20 μm in this cross section. Since the configuration of the peripheral and corner cells is the same with that of the first embodiment, its explanation is omitted.

The temperature dependence of the avalanche withstand capability of the third embodiment of the MOSFET is shown by the line 24 in FIG. 8. The avalanche withstand capability of the third embodiment of the MOSFET is 1.7 times at 25° C. and 4.8 times at 125° C. as large as the withstand capability shown by the line 22 of the MOSFET according to the prior art.

In the third embodiment the ratio of the area of the cells to the exposed area of the n-type substrate can be changed so as to meet the requirements of the specific MOSFET.

Figure 13A:
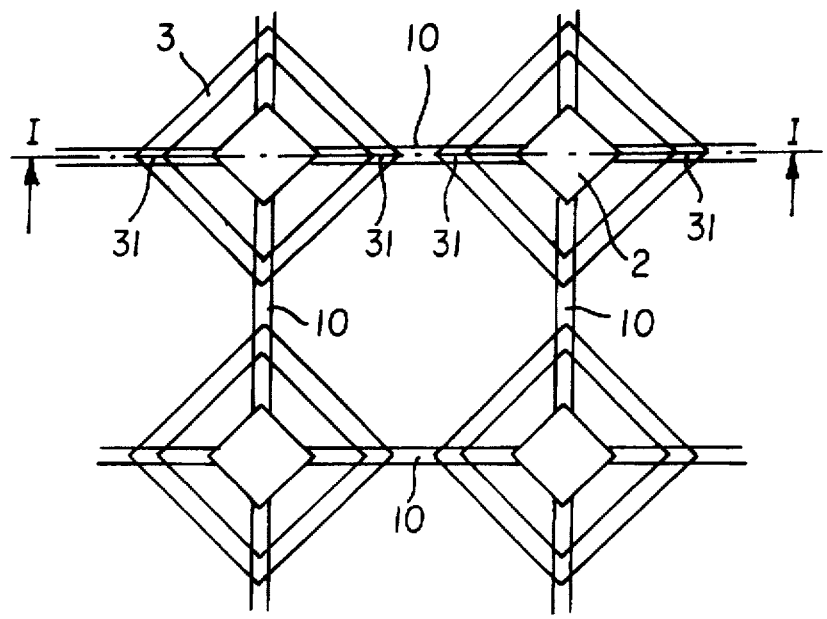
FIG. 13(a) is a top plan view showing fourth embodiment of the MOSFET according to the present invention from which an upper structure of the MOSFET is omitted and FIG. 13(b) is a sectional view along I—I of FIG. 13(a)
Figure 13B:
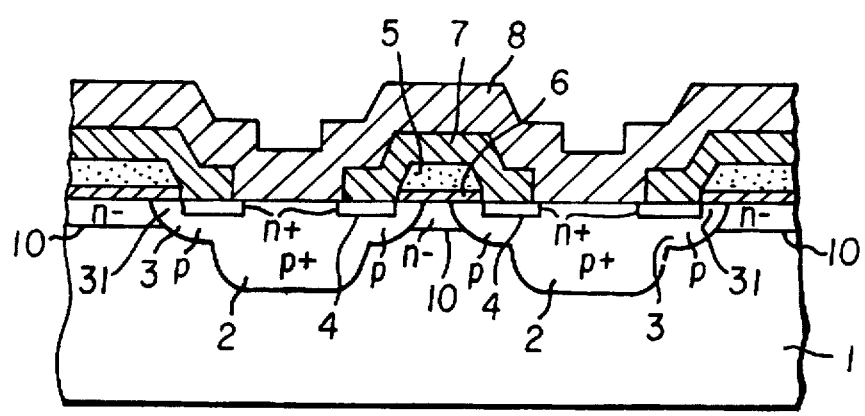

FIGS. 13(a) and 13(b) show the fourth embodiment of the MOSFET according to the present invention. FIG. 13(a) is a top plan view from which an upper structure of the MOSFET is omitted, and FIG. 13(b) is a sectional view along I—I of FIG. 13(a). In FIGS. 13(a) and 13(b), the same parts with those in the figures already explained are designated by the same reference numerals. In the fourth embodiment, the acceptor impurities are diffused in the portion in which the p⁻stripe region 9 of FIGS. 11 and 12 is to be formed so that the portion may not be inverted to p-type and may remain as an n⁻ stripe region 10 with high resistivity. The acceptor impurities are doped in the high impurity concentration region 31 near the corner of the p-channel region 3 simultaneously with the impurity doping for forming the p⁻stripe region 9 to lower the channel resistance of the high impurity concentration region 31. Since this processing facilitates spread of the depletion layer around the corner of the square cell as in the third embodiment of FIGS. 11 and 12, the withstand voltage of the corner of the square cell is prevented from lowering. The lowered channel resistance of the high impurity concentration region 31 prevents the avalanche withstand capability from lowering. Also in the fourth embodiment, the withstand voltage and the avalanche withstand capability can be prevented from lowering simply by forming the n⁻stripe region 10 in the vicinity of the corner of the square cell. For improving the withstand voltage and the avalanche withstand capability, it is not always necessary to link the corners of the quadrangular cells by the n⁻ stripe region 10.

Figure 14:
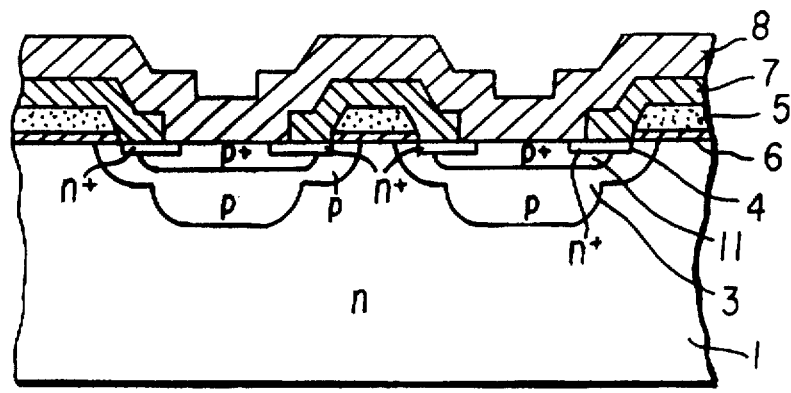
FIG. 14 is a sectional view showing the fifth embodiment of the MOSFET according to the present invention.

FIG. 14 is a sectional view showing a fifth embodiment of the MOSFET according to the present invention. In FIG. 14, the same parts with those in the figures already explained are designated by the same reference numerals. In the fifth embodiment, a shallow p-type base region 11 with shallow diffusion depth and with higher impurity concentration than that of the p-channel region 3 is formed in a part of the surface layer of the p-channel region 3 of FIG. 2. The shallow base region 11 is formed, for example, by implanting boron ions at the boron ion dose amount of $1\times10^{15}$ to $3\times10^{15}$ cm$^{-2}$; and by heat treatment to the diffusion depth of 0.5 to 1 μm. Since the channel resistance is lowered by the shallow p-type base region 11, the operation of the parasitic transistor is suppressed and the avalanche withstand capability is improved.

Figure 15:
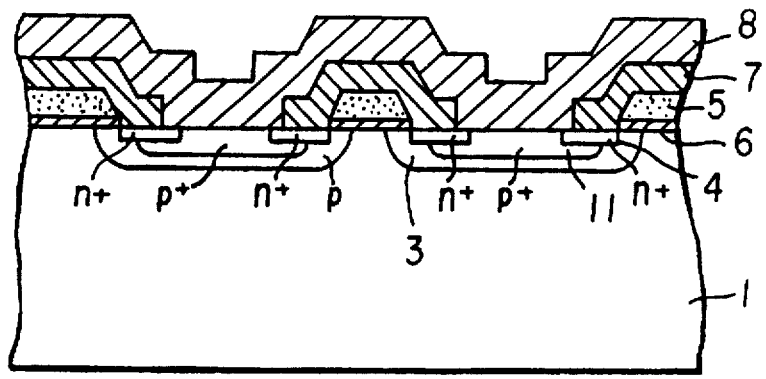
FIG. 15 is a sectional view showing the sixth embodiment of the MOSFET according to the present invention.

FIG. 15 is a sectional view showing a sixth embodiment of the MOSFET according to the present invention. In FIG. 15, the same parts with those in the figures already explained are designated by the same reference numerals. In the sixth embodiment, the shallow p+ base region 11 with higher impurity concentration than that of the p-channel region 3 is formed in a part of the surface layer of the p-channel region 3 similarly as in the fifth embodiment of FIG. 14. However, the p+ well region 2 is not formed in the sixth embodiment. Since the channel resistance is lowered by the provision of the shallow p+ base region 11 as well as by the improvement of the cell arrangement, the operation of the parasitic resistance is suppressed and the avalanche withstand capability is improved. Therefore, the practically acceptable avalanche withstand capability is obtained and the problem of the ON-resistance decrease mentioned earlier is solved without forming the p+ well region 2. Since the p+ well region 2 with deep diffusion depth can be omitted, time and cost for manufacturing the MOSFET is greatly saved.

A MOS type semiconductor device could also be possible which includes an n type region 101, whose resistivity is lower than that of the n type substrate (appropriately denoted as n(n−) since impurity concentration in the substrate 1 is lower than in the n type region 101) but higher than that of the n+ source region 4, and which is disposed in the vicinity of the surface of the n(n−) type substrate between the p channel regions 3. However, the avalanche withstand capability in this case would hardly be improved and ON-resistivity reduction by the effect of the low resistivity n type region 101 would be limited. On the other hand, in the semiconductor device of the present invention, lower resistivity in the n type region is possible because doping concentration in the n type region 101 can be increased without deterioration of the avalanche withstand capability or withstand voltage. An embodiment of this case is described below.

Figure 16:
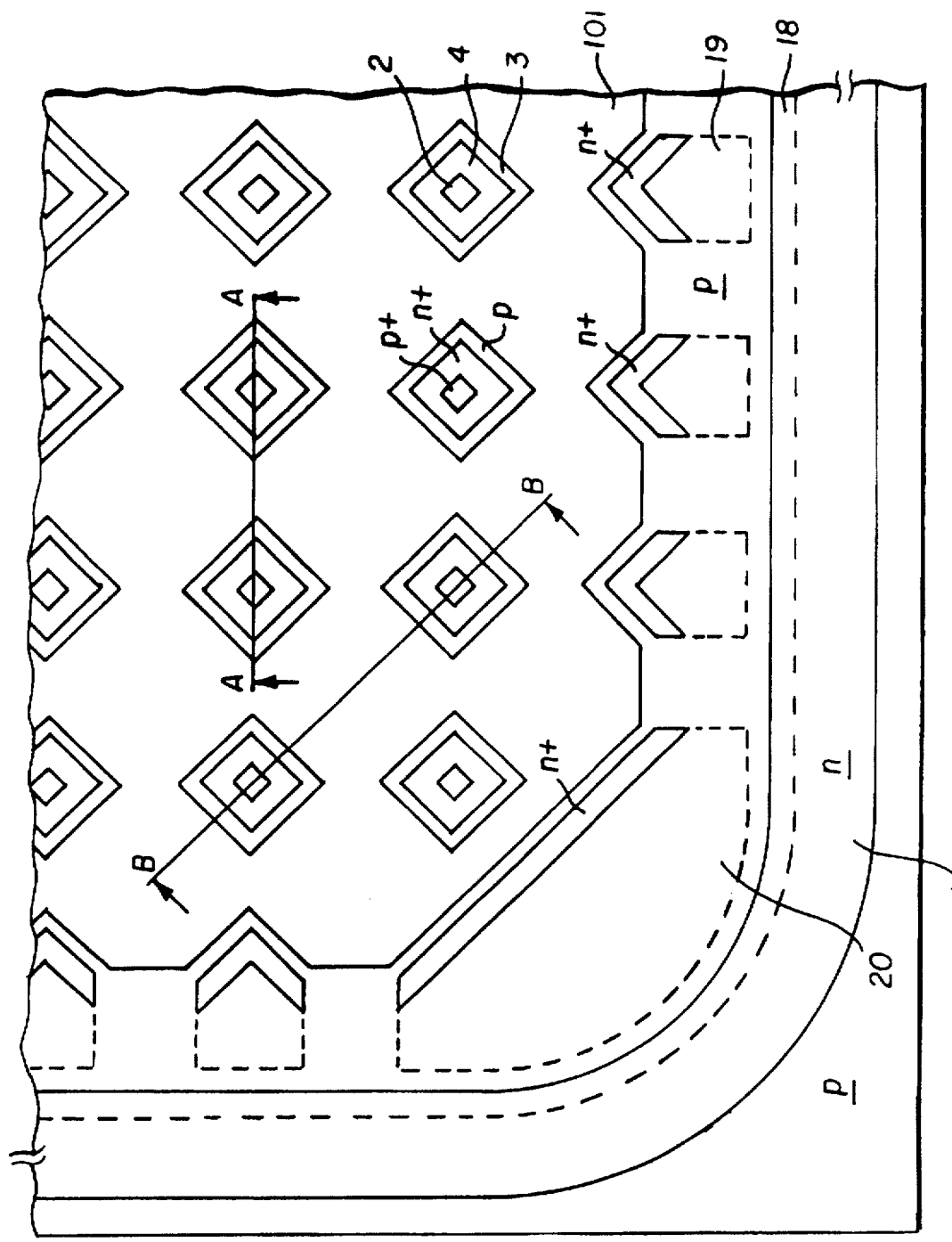
FIG. 16 is a top plan view showing a seventh embodiment of a MOSFET of the present invention.
Figure 17A:
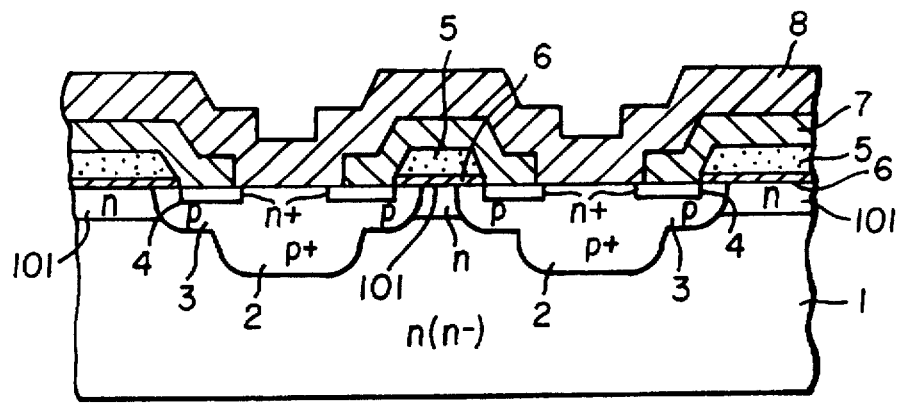
FIG. 17(a) is a sectional view taken along line A—A of FIG. 16
Figure 17B:
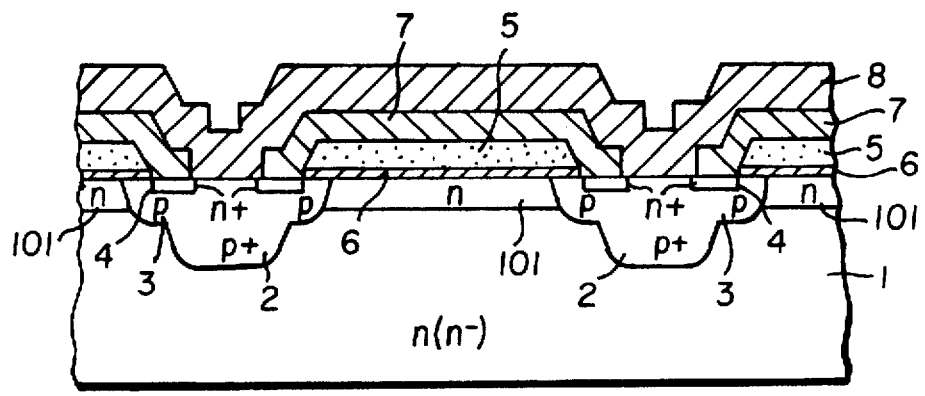
FIG. 17(b) is a sectional view taken along line B—B of FIG. 16.

In FIGS. 16, 17(a) and 17(b), n type regions 101 are formed in the vicinity of the surface of the n(n−) type substrate 1. Resistivity of the n type regions 101 is lower than that of the n(n−) type substrate 1. The dose amount of the phosphor ions in the n type regions 101 is from $5 \times 10^{11}$ to $5 \times 10^{12}$ cm$^{-2}$ and the diffusion depth is from 2 to 4 microns. The construction on the n type regions of this type can be applied to the embodiments in FIGS. 9 and 15.

In the embodiments described above, the doping concentration can be increased in comparison with the prior art devices, which results in lower resistivity of the n type regions 101 and thus decreases the ON-resistance or, alternatively, the surface area of the n type regions 101 can be reduced proportionally to its decrease in resistivity, which in turn reduces gate-drain capacitance ensuring fast switching speed.

Though the present invention has been explained by the embodiment of the MOSFETs, the present invention is applicable to the MOS semiconductor devices such as bipolar transistors, MCTs (MOS control thyristors, etc. which have a MOS structure.

According to the present invention, lowering of the withstand voltage around the corners of the quadrangular cell of the MOS type semiconductor device and lowering of the avalanche withstand capability can be prevented by closing the spacing between the corners of the neighboring cellular structures, by which to encourage expansion of a depletion layer. The lowering of the withstand voltage around the corners of the quadrangular cells and lowering of the avalanche withstand capability can be prevented more effectively by positioning the corners of the channel region in close proximity to the corners of the neighboring channel regions, by joining the corners of the neighboring channel regions each other, or by forming stripe diffusion regions of higher resistivity and of the same conductivity type with that of the channel region or the semiconductor substrate. The stripe diffusion regions decrease the capacitance between the gate and the drain, and therefore contribute to increasing switching speed of the MOSFET. The avalanche withstand capability is also improved by minimizing the curvature of the pn junctions in the peripheral and corner cells surrounding the quadrangular cells, and by widening the areas of the peripheral and corner cells. The avalanche withstand capability is further improved by lowering the channel resistance by means of the shallow base region formed in the channel region.

What is claimed is:

1. A MOS type semiconductor device comprising:
    a semiconductor layer of a first conductivity type; and
    a plurality of quadrangular cells, wherein each quadrangular cell includes four major sides, a channel region of a second conductivity type formed in a surface layer of the semiconductor layer, and a source region of the first conductivity type formed in the channel region including sides that are parallel to the major sides of the quadrangular cell;
    wherein a distance between corners of the channel regions of two quadrangular cells, the corners thereof facing opposed to each other, is shorter than the distance between sides of the channel regions of two quadrangular cells, the sides thereof facing opposed to each other; and
    wherein stripe regions of the second conductivity type and with higher resistivity than the resistivity of the channel region, are formed more shallow than the channel region in the surface layer of the semiconductor layer in contact with the channel regions on diagonals of the quadrangular cells.

2. The MOS type semiconductor device as claimed in claim 1, wherein diagonals of the channel regions of two nearest neighboring quadrangular cells are aligned on a line.

3. The MOS type semiconductor device as claimed in claim 2, wherein the distance between the opposed facing corners of the channel regions of two nearest neighboring cells are separated by 4 µm or less.

4. The MOS type semiconductor device as claimed in claim 2, wherein the opposed facing corners of the channel regions of two nearest neighboring cells are joined with each other.

5. The MOS type semiconductor device as claimed in claim 1, wherein regions, with higher impurity concentration than the impurity concentration of second conductivity type, are formed in the channel region in contact with the stripe regions.

6. The MOS type semiconductor device as claimed in claim 1, further comprising a plurality of peripheral cells located around the periphery of the semiconductor device, wherein each peripheral cell comprises a channel region including an outermost side, and wherein at least a portion of the outermost side lies in parallel to a side of a semiconductor device.

7. The MOS type semiconductor device as claimed in claim 6, further comprising corner cells located at corners of the semiconductor device, wherein each corner cell comprises a channel region including an outermost side, and wherein the outermost side of a channel region is an arc convex toward a corner of the semiconductor device.

8. The MOS type semiconductor device as claimed in claim 7, wherein an area of the corner cell is larger than an area of the peripheral cell.

9. The MOS type semiconductor device as claimed in claim 6, wherein a source region of the first conductivity type is formed in each peripheral cell on a central side of the semiconductor device.

10. The MOS type semiconductor device as claimed in claim 6, further comprising corner cells located at corners of the semiconductor device, wherein each corner cell comprises a channel region including an outermost side, and wherein the outermost side of the channel region is a polygonal line approximating an arc convex toward a corner of the semiconductor chip.

11. The MOS type semiconductor device as claimed in claim 1, further comprising corner cells located at corners of the semiconductor device, wherein each corner cell comprises a channel region including an outermost side, and wherein the outermost side of a channel region is an arc convex toward a corner of the semiconductor device.

12. The MOS type semiconductor device as claimed in claim 1, further comprising corner cells located at corners of the semiconductor device, wherein each corner cell comprises a channel region including an outermost side, and wherein the outermost side of the channel region is a polygonal line approximating an arc convex toward a corner of the semiconductor chip.

13. The MOS type semiconductor device as claimed in claim 1, wherein a shallow base region of a second conductivity type, the impurity concentration thereof is higher than the impurity concentration of the channel region and the diffusion depth thereof is shallower than the diffusion depth the channel region, is formed in a portion of a surface layer of the channel region.

14. A MOS type semiconductor device comprising:
a semiconductor layer of a first conductivity type and
a plurality of quadrangular cells, wherein each quadrangular cell includes four major sides, a channel region of a second conductivity type formed in a surface layer of the semiconductor layer, and a source region of the first conductivity type formed in the channel region including sides that are parallel to the major sides of the quadrangular cell;
wherein a distance between corners of the channel regions of two quadrangular cells, the corners thereof facing opposed to each other, is shorter than the distance between sides of the channel regions of two quadrangular cells, the sides thereof facing opposed to each other; and
wherein stripe regions, of the first conductivity type and with higher resistivity than the resistivity of the semiconductor layer, are formed more shallow than the channel region in the surface layer of the semiconductor layer adjacent to the channel region on diagonals of the cells.

15. The MOS type semiconductor device as claimed in claim 14, wherein regions, with higher impurity concentration than the impurity concentration of second conductivity type, are formed in the channel region in contact with the stripe regions.

16. The MOS type semiconductor device as claimed in claim 14, wherein diagonals of the channel regions of two nearest neighboring quadrangular cells are aligned on a line.

17. The MOS type semiconductor device as claimed in claim 16, wherein the distance between the opposed facing corners of the channel regions of two nearest neighboring cells are separated by 4 μm or less.

18. The MOS type semiconductor device as claimed in claim 16, wherein the opposed facing corners of the channel regions of two nearest neighboring cells are joined with each other.

19. A MOS type semiconductor device comprising:
a semiconductor layer of a first conductivity type; and
a plurality of quadrangular cells, wherein each quadrangular cell includes four major sides a channel region of a second conductivity type formed in a surface layer of the semiconductor layer and a source region of the first conductivity type formed in the channel region including sides that are parallel to the major sides of the quadrangular cell;
wherein a distance between corners of the channel regions of two quadrangular cells, the corners thereof facing opposed to each other, is shorter than the distance between sides of the channel regions of two quadrangular cells, the sides thereof facing opposed to each other;
a plurality of peripheral cells located around the periphery of the semiconductor device, wherein each peripheral cell comprises a channel region including an outermost side, and wherein at least a portion of the outermost side lies in parallel to a side of a semiconductor device;
wherein a source region of the first conductivity type is formed in each peripheral cell on a central side of the semiconductor device; and
wherein an area of the peripheral cell is wider than an area of the quadrangular cell.

20. A MOS type semiconductor device comprising:
a semiconductor layer of a first conductivity type; and
a plurality of quadrangular cells, wherein each quadrangular cell includes four major sides, a channel region of a second conductivity type formed in a surface layer of the semiconductor layer, and a source region of the first conductivity type formed in the channel region including sides that are parallel to the major sides of the quadrangular cell;
wherein a distance between corners of the channel regions of two quadrangular cells, the corners thereof facing opposed to each others is shorter than the distance between sides of the channel regions of two quadrangular cells, the sides thereof facing opposed to each other;
corner cells located at corners of the semiconductor device wherein each corner cell comprises a channel region including an outermost side, and wherein the outermost side of a channel region is an arc convex toward a corner of the semiconductor device;
wherein an area of the corner cell is wider than an area of the peripheral cell.

21. A MOS type semiconductor device comprising:
a semiconductor layer of a first conductivity type; and
a plurality of quadrangular cells, wherein each quadrangular cell includes four major sides, a channel region of a second conductivity type formed in a surface layer of the semiconductor layer, and a source region of the first conductivity type formed in the channel region including sides that are parallel to the major sides of the quadrangular cell;
wherein a distance between corners of the channel regions of two quadrangular cells, the corners thereof facing opposed to each other, is shorter than the distance between sides of the channel regions of two quadrangular cells, the sides thereof facing opposed to each other;
corner cells located at corners of the semiconductor device, wherein each corner cell comprises a channel region including an outermost side, and wherein the outermost side of the channel region is a polygonal line approximating an arc convex toward a corner of the semiconductor chip; and
wherein an area of the corner cell is wider than an area of the peripheral cell.

22. A MOS type semiconductor device comprising:
a semiconductor layer of a first conductivity type; and
a plurality of quadrangular cells, wherein each quadrangular cell includes four major sides, a channel region of a second conductivity type formed in a surface layer of the semiconductor layer, and a source region of the first conductivity type formed in the channel region including sides that are parallel to the major sides of the quadrangular cell;
wherein a distance between corners of the channel regions of two quadrangular cells, the corners thereof facing opposed to each other, is shorter than the distance between sides of the channel regions of two quadrangular cells, the sides thereof facing opposed to each other;
a plurality of peripheral cells located around the periphery of the semiconductor device, wherein each peripheral cell comprises a channel region including an outermost side, and wherein at least a portion of the outermost side lies in parallel to a side of a semiconductor;
corner cells located at corners of the semiconductor device, wherein each corner cell comprises a channel region including an outermost side, and wherein the outermost side of the channel region is a polygonal line approximating an arc convex toward a corner of the semiconductor chip; and wherein an area of the corner cell is larger than an area of the peripheral cell.

23. A MOS type semiconductor device comprising:

a semiconductor layer of a first conductivity type; and a plurality of polygonal cells, wherein each polygonal cell includes major sides, a channel region of a second conductivity type formed in a surface layer of the semiconductor layer, and a source region of the first conductivity type formed in the channel region including sides that are parallel to the major sides of the polygonal cell;

a plurality of peripheral cells located around the periphery of the semiconductor device, wherein each peripheral cell comprises a channel region including an outermost side, and wherein at least a portion of the outermost side lies in parallel to a side of a semiconductor device; and wherein an area of the peripheral cell is wider than an area of the polygonal cell.

24. The MOS type semiconductor device as claimed in claim 23, wherein a source region of the first conductivity type is formed in each peripheral cell on a central side of the semiconductor device.

25. A MOS type semiconductor device comprising:

a semiconductor layer of a first conductivity type; and a plurality of polygonal cells, wherein each polygonal cell includes major sides, a channel region of a second conductivity type formed in a surface layer of the semiconductor layer, and a source region of the first conductivity type formed in the channel region including sides that are parallel to the major sides of the polygonal cell;

a plurality of peripheral cells located around the periphery of the semiconductor device, wherein each peripheral cell comprises a channel region including an outermost side, and wherein at least a portion of the outermost side lies in parallel to a side of a semiconductor device, corner cells located at corners of the semiconductor device, wherein each corner cell comprises a channel region including an outermost side, wherein the outermost side of the channel region is an arc convex toward a corner of the semiconductor chip; and wherein an area of the peripheral cell is wider than an area of the polygonal cell.

26. A MOS semiconductor device as claimed in claim 25, wherein an area of the peripheral cell is wider than an area of the polygonal cell.

27. A MOS semiconductor device as claimed in claim 25, wherein the outermost side of the channel region is a polygonal line approximating an arc convex toward a corner of the semiconductor chip.

28. A MOS semiconductor device as claimed in claim 27, wherein an area of the peripheral cell is wider than an area of the polygonal cell.

29. A MOS semiconductor device as claimed in any one of claims 23, 25 and 27 wherein the polygonal cells are quadrangular cells including four major sides.

30. A MOS semiconductor device as claimed in claim 29, wherein a distance between corners of the channel regions of two quadrangular cells, the corners thereof facing opposed to each other, is shorter than the distance between sides of the channel regions of two quadrangular cells, the sides thereof facing opposed to each other.

31. A MOS semiconductor device as claimed in claim 30, wherein diagonals of the channel regions of two nearest neighboring quadrangular cells are aligned on a line.

32. A MOS semiconductor device as claimed in claim 31, wherein the distance between the opposed facing corners of the channel regions of two nearest neighboring cells are separated by 4 microns or less.

33. A MOS semiconductor device as claimed in claim 31, wherein the opposed facing corners of the channel regions of two nearest neighboring cells are joined with each other.

* * * * *